(12) United States Patent
Chang

(10) Patent No.: US 6,436,612 B1
(45) Date of Patent: Aug. 20, 2002

(54) METHOD FOR FORMING A PROTECTION DEVICE WITH SLOPE LATERALS

(75) Inventor: Ching-Yu Chang, I-Lan (TW)

(73) Assignee: Macronix International Co., Ltd. (TW)

(*) Notice: Subject to any disclaimer, the term of this patent is extended or adjusted under 35 U.S.C. 154(b) by 93 days.

(21) Appl. No.: 09/712,916

(22) Filed: Nov. 16, 2000

(51) Int. Cl.[7] .............................. G03F 7/30; C25F 3/02; H01L 21/461

(52) U.S. Cl. .................. 430/316; 430/311; 430/313; 430/317; 216/67; 216/72; 216/96; 216/99; 438/704; 438/713; 438/734; 438/751

(58) Field of Search .................................. 430/311, 313, 430/316, 317; 216/67, 72, 96, 99; 438/704, 713, 734, 751

(56) References Cited

U.S. PATENT DOCUMENTS 5,668,039 A * 9/1997 Lin .............................. 438/387
6,204,191 B1 * 3/2001 Jung et al. .................. 438/713

\* cited by examiner

Primary Examiner—Mark F. Huff
Assistant Examiner—Nicole Barreca

(57) ABSTRACT

A method for forming a protection device with slope laterals is provided. Firstly, providing a semiconductor substrate having a plurality of alternative first sacrificial layers and second sacrificial layers formed thereon. A first etching step is performed to remove one portion of each of the first sacrificial layers and thereby expose one portion of each lateral of each of the second sacrificial layers. Subsequently, performing a second etching step to remove one portion of the lateral of the second sacrificial layer. Then, repeatedly and alternately performing the first etching step and the second etching step until completely removing the first sacrificial layers and then obtaining a plurality of protection devices formed of the second sacrificial layers each of which having slope laterals.

21 Claims, 5 Drawing Sheets

METHOD FOR FORMING A PROTECTION DEVICE WITH SLOPE LATERALS

BACKGROUND OF THE INVENTION

1. Field of the Invention

The present invention relates to a process for forming a protection device on a semiconductor substrate, and more particularly to a method for forming a protection device with slope laterals on a semiconductor substrate.

2. Description of the Prior Art

FIG. 1A is a top view of a conventional MOS mask read only memory (ROM), and FIG. 1B and 1C are cross sectional views along line A–AA in FIG. 1A. As shown in the figures, the MOS mask ROM comprises a P type silicon substrate 100, and linear $N^+$ buried regions 101 and 102 are alternatively formed in parallel in one direction in the substrate 100. The linear $N^+$ buried regions 101 and 102 are formed by ion implantation with phosphorous or arsenic atoms. The $N^+$ buried region 101 forms a source region for a plurality of memory transistors (e.g. transistors "a" and "b") and corresponds to a ground line of the mask ROM. The $N^+$ buried region 102 forms a drain region for the transistors "a" and "b" and corresponds to a bit line of the mask ROM. Also, a gate oxide film 103 is formed over the substrate 100 and the $N^+$ buried regions 101 and 102, and a plurality of parallel word lines 104 made of polysilicon are formed on the gate oxide film 103. Also, the word lines 104 are formed perpendicularly to the linear $N^+$ buried regions 101 and 102 and serve as the gate electrodes of a plurality of memory transistors (e.g. transistors "a" and "c") in the mask ROM.

In the conventional MOS mask ROM mentioned above, the data stored in the ROM (i.e. a ROM code) is formed by selectively doping certain memory transistors with boron ions. Specifically, a photoresist is formed over the MOS mask ROM and boron is doped into selected transistors while using the photoresist as a mask, such process is referred to as a "code boron doping process". Since the threshold voltage $V_T$ of a boron-doped memory transistor increases and the threshold voltage $V_T$ of an undoped transistor remains the same, data can be read from the ROM based on the difference between the threshold voltages $V_T$ of the transistors. For example, a transistor having a high threshold voltage $V_T$ will not turn on when a voltage $V_{read}$ (having a voltage lower than the high threshold voltage $V_T$) is applied to its gate electrode (i.e. the word line 104). On the other hand, a transistor having a normal threshold voltage $V_T$ will turn on when the voltage $V_{read}$ is applied to the gate electrode (i.e. the word line 104). The ROM may consider the transistors that do not turn on to output a logic "1" and may consider the transistors that turn on to output a logic "0".

Referring to FIG. 1B, when performing the code boron doping process to form a ROM code, a photoresist 105 is formed over the word lines 104 made of polysilicon as a mask for the $N^+$ buried regions 101 and 102. However, the photoresist 105 is not always in alignment with the $N^+$ buried regions 101 and 102. The boron atoms will be implanted into one portion of the $N^+$ buried regions 101 and 102, and then neutralize electricity of the doped portion of the $N^+$ buried regions 101 and 102. Therefore, the current in the $N^+$ buried regions 101 and 102 is reduced. While, a measure to overcome the problem of one portion of the $N^+$ buried regions 101 and 102 being boron-implanted is to form a protection region 106 over each of the $N^+$ buried regions 101 and 102, as shown in FIG. 1C. Then, the word lines 104 made of polysilicon are formed on the protection regions 106.

In general, a metal silicide, for example, a cobalt silicide, is formed on a polysilicon layer to be formed word lines 104 to increase its conductivity. However, when etching the metal silicide, the residue of the metal silicide, for example, cobalt residue, is readily left on each vertical sidewall of the polysilicon layer to be formed word lines 104, and the residue of the metal silicide is still left on these vertical sidewalls after the word lines 14 formed. As a result, there is an electric conductivity between two word lines 104, and then the electricity of the MOS mask ROM is fail, due to the reside of the metal silicide.

Accordingly, there exists a desirability to provide a method for forming a plurality of protection devices each of which with slope laterals on a semiconductor substrate with a plurality of buried diffusion regions formed therein. The slope laterals of the protection devices can facilitate etching away a metal residue left on the sidewalls of the word lines made of polysilicon formed on the protection devices after a silicide of the metal is formed on the word lines.

SUMMARY OF THE INVENTION

It is one object of the present invention to provide a method for forming a protection device with slope laterals on a semiconductor substrate, in which a first etching step and a second etching step are repeatedly and alternately performed on the substrate with a plurality of alternative first sacrificial layers and second sacrificial layers formed thereon. The first etching step and the second etching step respectively have different etching selectivity with respect to the first sacrificial layer and the second sacrificial layer. And thereby, a plurality of protection devices with slope laterals are formed on the substrate.

It is another object of the present invention to provide a method for forming a protection device with slope laterals. The slope laterals of the protection device can facilitate etching away a metal residue left on each sidewall of a conductive layer formed on the protection device.

It is still a further object of the present invention to provide a method for forming a plurality of protection devices each of which having slope laterals on a semiconductor substrate with a plurality of buried diffusion regions formed therein. Each of the protection devices is formed over each of the buried diffusion regions, and a conductive layer is formed on the protection devices. The buried diffusion regions are served as bit lines of a mask read only memory (mask ROM), and the conductive layer is patterned to serve as word lines of the mask ROM. By means of the slope laterals of the protection devices, a metal residue left on each sidewall of the word lines formed of the patterned conductive layer is readily etched away after the conductive layer is patterned to form the word lines.

In order to achieve the above and other objects, the present invention provides a method for forming a protection device with slope laterals. Firstly, providing a semiconductor substrate having a plurality of alternative first sacrificial layers and second sacrificial layers formed thereon. A first etching step is performed to remove one portion of each of the first sacrificial layers and thereby expose one portion of each lateral of the second sacrificial layers. Subsequently, performing a second etching step to remove one portion of the lateral of the second sacrificial layer. Then, repeatedly and alternately performing the first etching step and the second etching step until completely removing the first sacrificial layers and then obtaining a plurality of protection devices formed of the second sacrificial layers each of which having slope laterals.

BRIEF DESCRIPTION OF THE DRAWINGS

The present invention can be best understood through the following description and accompanying drawings wherein.

DESCRIPTION OF THE EMBODIMENTS

Figure 1A:
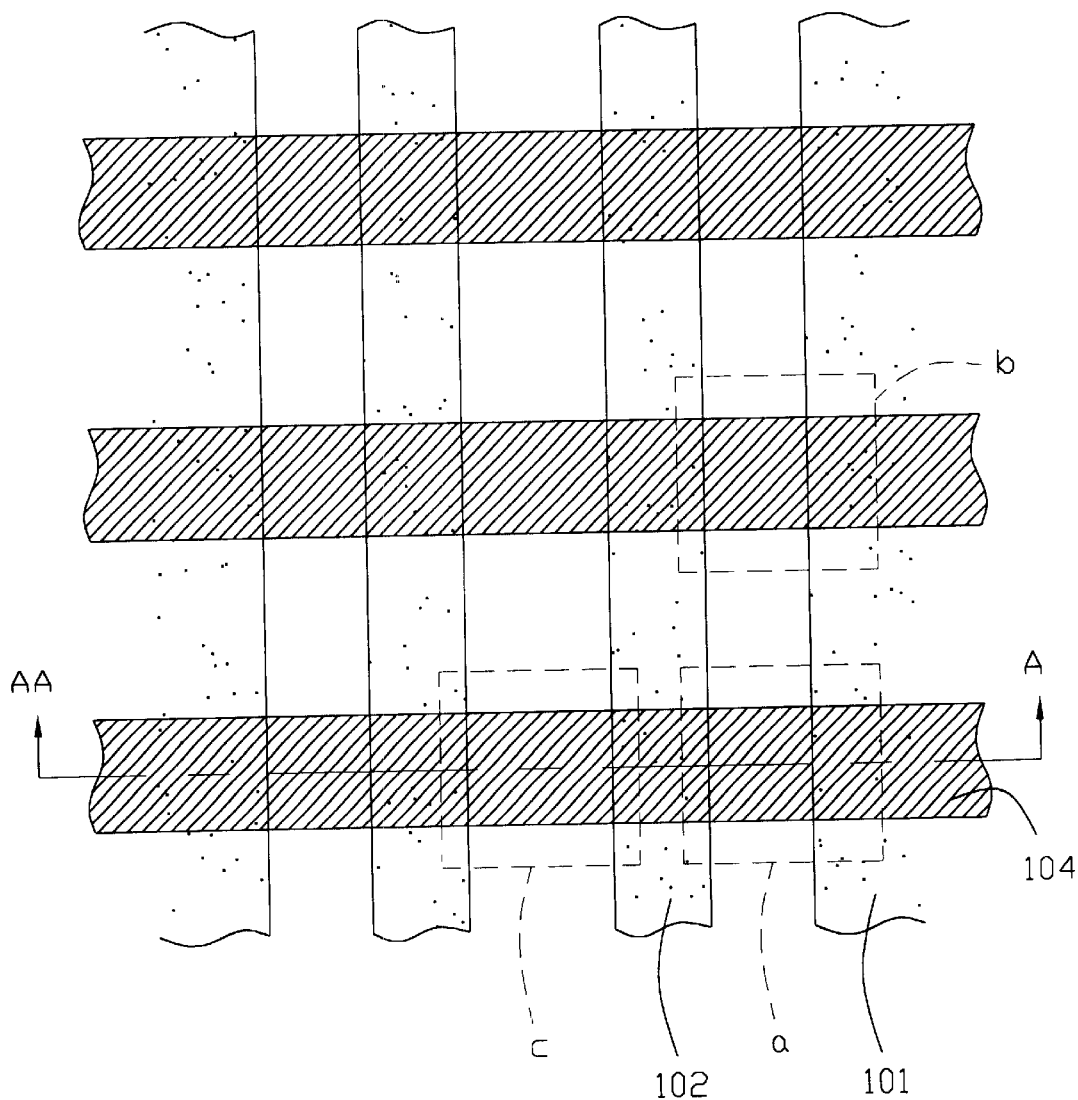
FIG. 1A is a top view of a conventional MOS mask ROM.
Figure 1B:
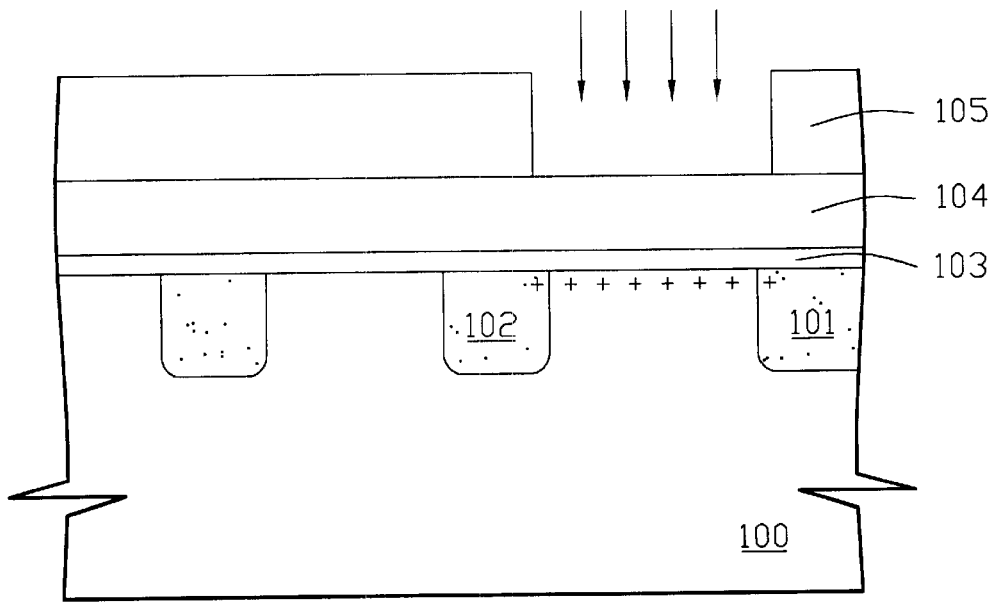
FIG. 1B is a cross sectional view along a line A–AA in FIG. 1, illustrating a process in which ions are implanted through a polysilicon layer.
Figure 1C:
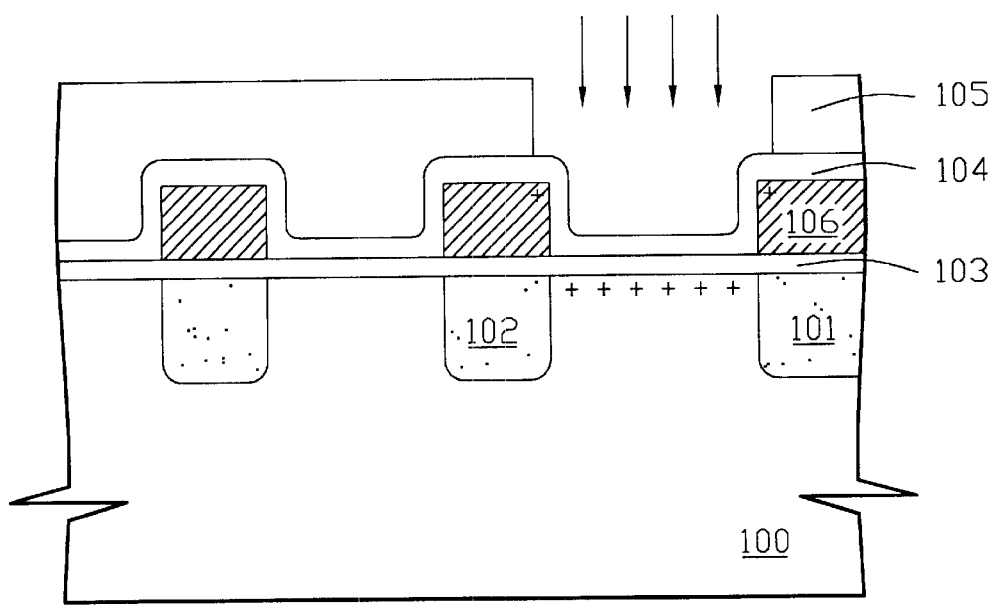
FIG. 1C is a cross sectional view along a line A–AA in FIG. 1, illustrating a process in which ions are implanted through a polysilicon layer formed on a plurality of protection regions.
Figure 2:
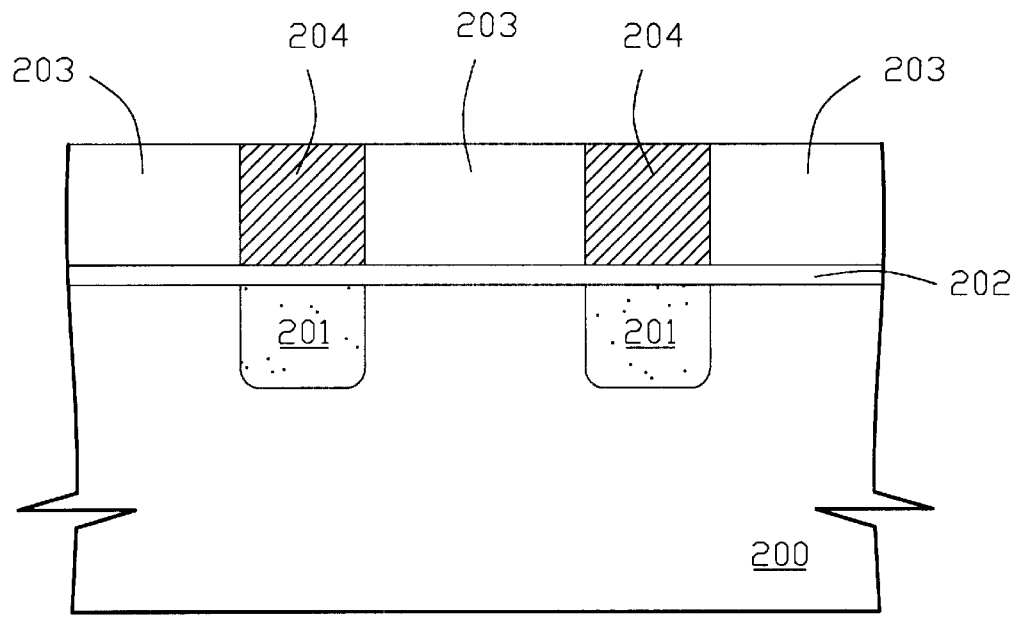
FIG. 2 to FIG. 7 are cross sectional views of various steps of the method according to one first embodiment of the present invention.

FIG. 2 to FIG. 7 depict cross sectional views of various steps of the method according to one first embodiment of the present invention. The method of the first embodiment is employed to form a plurality of protection devices with slope laterals on a semiconductor substrate having a plurality of buried diffusion regions formed therein served as bit lines of a mask ROM. While any structure formed of a plurality of alternative first layers and second layers which perform different etching rate with respect to the same one etching method is also satisfied with the present invention Referring to FIG. 2, firstly, providing a P type silicon substrate 200 with linear N+ buried diffusion regions 201 in parallel in one direction formed therein. The buried diffusion regions 201 are formed by way of doping method with phosphorous or arsenic atoms. A gate oxide layer 202 is formed on the substrate 200. Then, by way of chemical vapor deposition and photolithography and etching method, a plurality of first sacrificial layers of silicon nitride ($Si_3N_4$) 203 are formed on the gate oxide layer 202. Afterward, forming a silicon dioxide layer over the first sacrificial layers of silicon nitride 203, and then planarizing the silicon dioxide layer by way of chemical mechanical polishing method or etching back to form a plurality of second sacrificial layers of silicon dioxide 204 on the gate oxide layer 202. Each of the second sacrificial layers 204 is formed over each of the N+ buried diffusion region 201. Thereby, a structure with alternative first sacrificial layers 203 and second sacrificial layers 204 are formed on the gate oxide layer 202. The first sacrificial layers 203 are also can be formed of silicon oxynitride (SiON), and the second sacrificial layers of silicon dioxide 204 can be formed by way of thermal oxidation. The second sacrificial layers of silicon dioxide 204 also can be formed of phosphosilicate glass (PSG), borophosphosilicate glass (BPSG) and spin-on glass (SOG). Additionally, the second sacrificial layers of silicon dioxide 204 can be formed by low pressure CVD method utilizing $TEOS/O_3$ as reaction gas at temperature of 650~750° C., or by high density plasma chemical vapor deposition method. However, it is acceptable to exchange the priority of forming the first sacrificial layers 203 and the second sacrificial layers 204.

Figure 3:
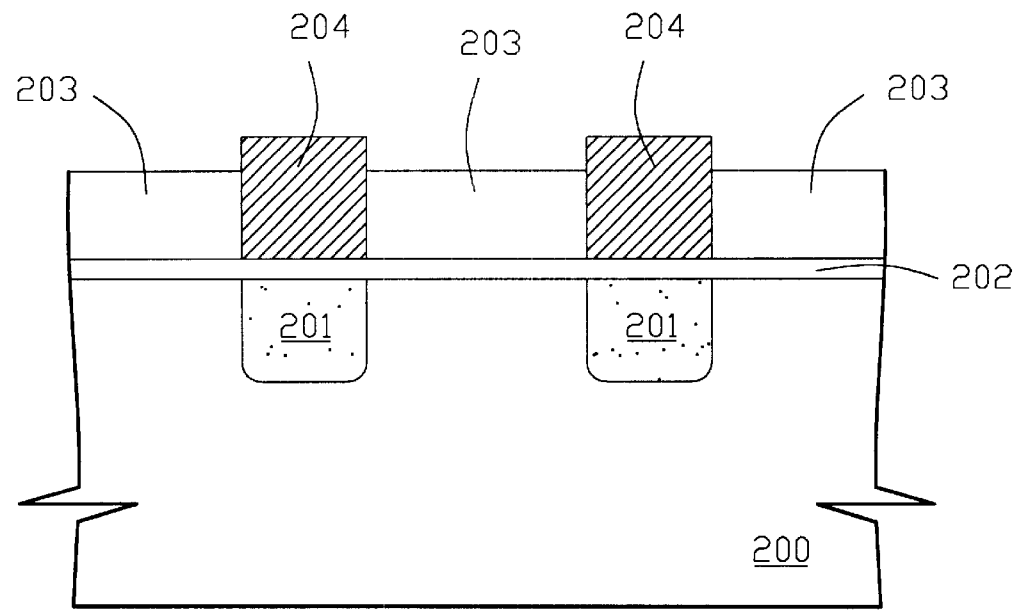
Figure 4:
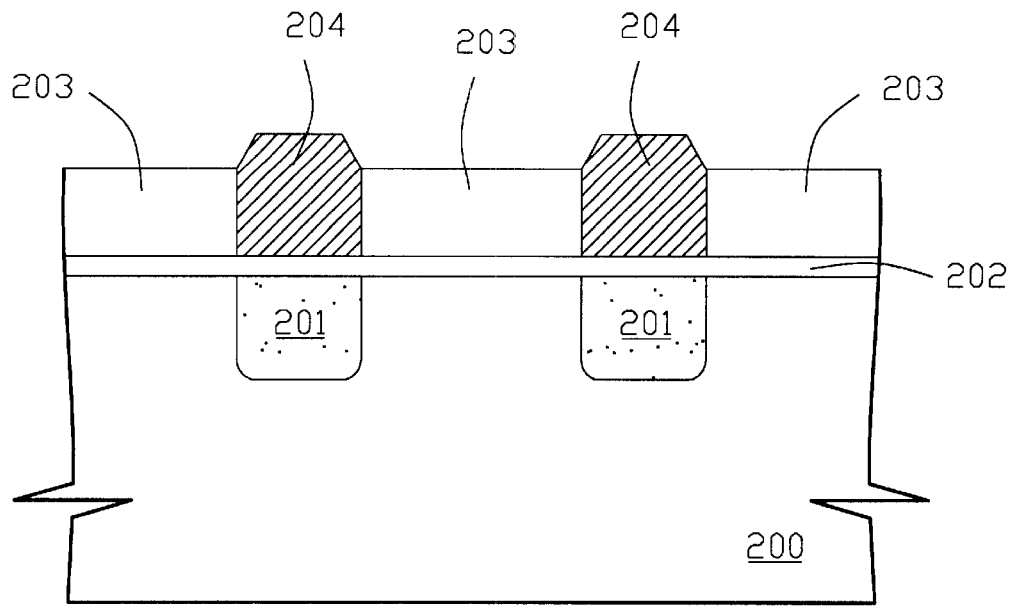

Subsequently, referring to FIG. 3, performing a first etching step to remove one portion of each of the first sacrificial layers of silicon nitride/or silicon oxynitride 203 and then expose one portion of each lateral of the second sacrificial layer of silicon dioxide 204. With respect to $H_3PO_4$ aqueous solution having a concentration about 86 wt. % at a temperature of 150~180° C., the etching rate of silicon nitride/or silicon oxynitride is about 50 angstroms/per minute, and the etching rate of silicon dioxide is about 0~0.5 angstroms/per minute. While for HF aqueous solution with a concentration about 0.20 wt. %~49 wt. % or the $NH_4F/HF$ aqueous solution with a volume concentration about 5:1~500:1, the etching rate of silicon nitride/or silicon oxynitride is about zero, and the etching rate of silicon dioxide is about 80 angstroms/per minute. Therefore, the first etching step can be performed by way of wet etching, utilizing $H_3PO_4$ aqueous solution with a concentration of 86 wt. % at a temperature of about 150~180° C., preferably at a temperature of 160° C. Then, utilizing ionized water to rinse the whole structure on the substrate 200. Referring to FIG. 4, thereafter, performing a second etching step to remove one portion of the exposed lateral of the second sacrificial layers of silicon dioxide 204. The second etching step can be performed by wet dip, utilizing HF aqueous solution with a concentration of about 0.20 wt. %~49 wt. % or $NH_4F/HF$ aqueous solution with a volume concentration of about 5:1~500:1. Then, utilizing ionized water to rinse the whole structure on the substrate 200.

Figure 5:
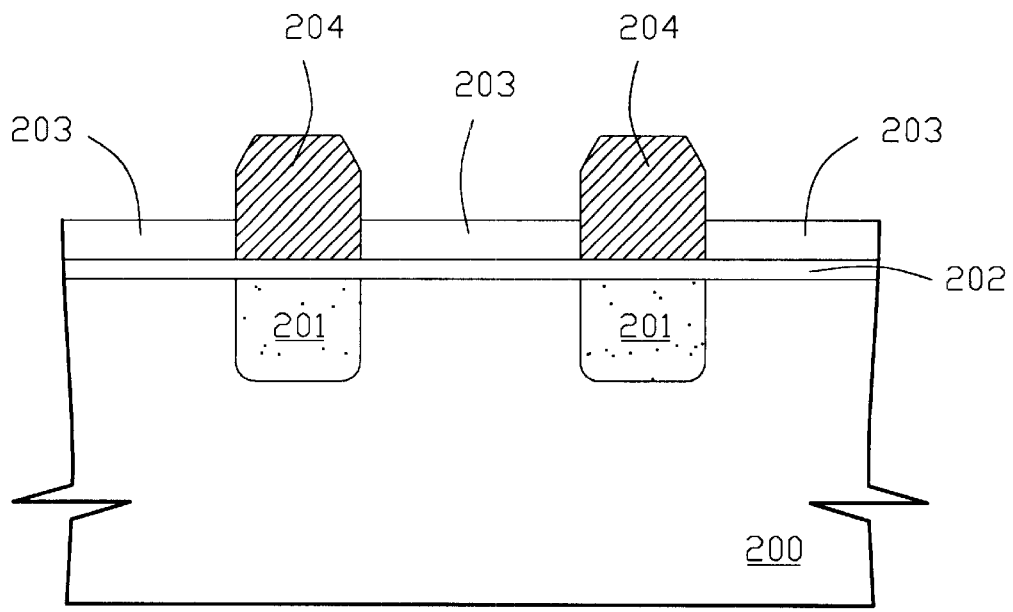
Figure 6:
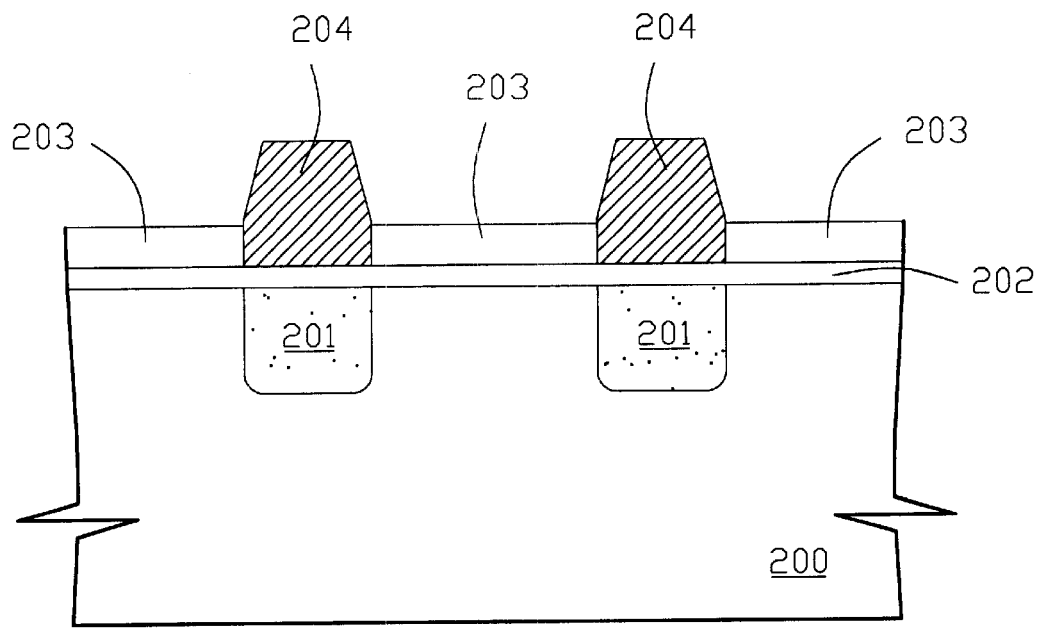

Referring to FIG. 5, continuously, performing the first etching step to remove more of the first sacrificial layers 203, and then expose more of the laterals of the second sacrificial layers 204. Referring to FIG. 6, the second etching step is performed following the first etching step to remove the exposed laterals of the second sacrificial layers 204, and thus the laterals of the second sacrificial layers 204 gradually become slope. Please note a rinse step with ionized water is employed between the first etching step and the second etching step.

Figure 7:
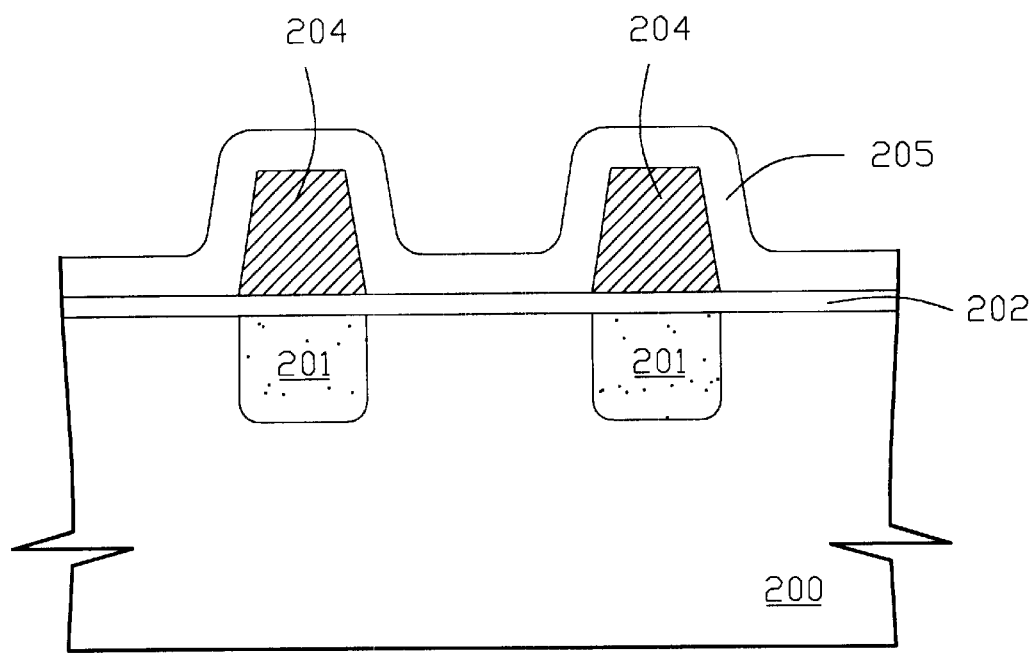

Repeatedly and alternately performing the first etching step and the second etching step until the first sacrificial layers 203 are completely removed from the substrate 200 and then the laterals of the second sacrificial layers 204 become slope, as shown in FIG. 7. However, at final, an over etching is generally performed to completely remove the first sacrificial layers 203. A polysilicon layer 205 is then formed on the second sacrificial layers 204 with slope laterals, which is to be patterned to a plurality of word lines.

Therefore, by the present method, a plurality of protection devices formed of the second sacrificial layers 204 each of which having slope laterals is provided. The profile of the slope lateral of the second sacrificial layer 204 becomes more smooth when the cycle times of the first etching step and the second etching steps are increased. While the lateral slope of the second sacrificial layer 204 is determined based on the respective time $T_1$ and $T_2$ for performing the first etching step and the second etching step. For example, the longer $T_1$ is and the shorter $T_2$ is, the lateral slope of the second sacrificial layer 204 becomes smaller. To the contrary, the shorter $T_1$ is and the longer $T_2$ is, the lateral slope of the second sacrificial layer 204 becomes larger.

In the first embodiment, the thickness of both of the first sacrificial layer 203 and the second sacrificial layer 204 is about 1000 angstroms. The whole substrate 200 is immersed into the $H_3PO_4$ aqueous solution about 4 minutes during each first etching step, and dipped into the HF aqueous solution about 2 minutes during each second etching step. The first etching step and the second etching step are cycled four times, and finally utilizing the $H_3PO_4$ aqueous solution to over etch the rest first sacrificial layers 203 in order to completely remove them away from the substrate 200.

In a second embodiment of the present invention, the first sacrificial layer 203 are formed of a photoresist, such as, positive photoresist, negative photoresist, i line photoresist, DUV line (deep UV line) photoresist and ArF laser photoresist. The second sacrificial layers 204 are formed of silicon dioxide, by way of chemical vapor deposition method, utilizing a mixture of $SiH_4$ and $H_2O_2$ as reaction gas at the temperature of 0° C. Alternately, the second sacrificial layers 204 can be formed of spin-on glass. A first etching step utilizing $O_2$ plasma is performed to remove the first sacrificial layers 203 formed of a photoresist. A second etching step is performed to remove the exposed laterals of the second sacrificial layers 204 by way of wet dip utilizing a HF aqueous solution which is the same with that used in the first embodiment.

The embodiments are only used to illustrate the present invention, not intended to limit the scope thereof. Many modifications of the embodiments can be made without departing from the spirit of the present invention.

What is claimed is:

1. A method for forming a protection device with slope laterals, comprising:

providing a semiconductor substrate having a plurality of alternative first sacrificial layers and second sacrificial layers formed thereon;

performing a first etching step to remove one portion of each of said first sacrificial layers and thereby expose one portion of each lateral of each of said second sacrificial layers;

performing a second etching step to remove one portion of said exposed lateral of said second sacrificial layer; and repeatedly and alternately performing said first etching step and said second etching step until completely removing said first sacrificial layers and thereby providing a plurality of said protection devices formed of said second sacrificial layers each of which having slope laterals.

2. The method of claim 1, wherein said first sacrificial layer comprises silicon nitride ($Si_3N_4$).

3. The method of claim 2, wherein said first etching step is performed by a wet etching method utilizing $H_3PO_4$ aqueous solution with a concentration of 86 wt. % at a temperature of 150~180° C.

4. A The method of claim 1, wherein said first sacrificial layer comprises silicon oxynitride (SiON).

5. The method of claim 4, wherein said first etching step is performed by a wet etching method utilizing $H_3PO_4$ aqueous solution with a concentration of 86 wt. % at a temperature of 150~180° C.

6. The method of claim 1, wherein said second sacrificial layer comprises silicon dioxide.

7. The method of claim 6, wherein said second sacrificial layer comprises silicon dioxide formed by thermal oxidation.

8. The method of claim 6, wherein said second sacrificial layer comprises silicon dioxide formed by low pressure CVD method, utilizing $TEOS/O_3$ as reaction gas at temperature of 650~750° C.

9. The method of claim 6, wherein said second sacrificial layer comprises silicon dioxide formed by high density plasma chemical vapor deposition method.

10. The method of claim 6, wherein said second sacrificial layer comprises silicon dioxide selected from a group consisting of phosphosilicate glass (PSG), borophosphosilicate glass (BPSG) and spin-on glass (SOG).

11. The method of claim 6, wherein said second etching step is performed by wet dip method utilizing HF aqueous solution with a concentration of about 0.20 wt. %~49 wt. %.

12. The method of claim 6, wherein said second etching step is performed by wet dip method utilizing $NH_4F/HF$ aqueous solution with a volume concentration of about 5:1~500:1.

13. The method of claim 1, wherein said first sacrificial layer comprises a photoresist.

14. The method of claim 13, wherein said first sacrificial layer comprises a photoresist selected from a group consisting of i line photoresist, DUV line (deep UV line) photoresist and ArF laser photoresist.

15. The method of claim 13, wherein said first sacrificial layer comprises a positive photoresist.

16. The method of claim 13, wherein said first sacrificial layer comprises a negative photoresist.

17. The method of claim 13, wherein said first etching step is performed by $O_2$ plasma.

18. The method of claim 13, wherein said second sacrificial layer comprises silicon dioxide formed by way of chemical vapor deposition method, utilizing a mixture of $SiH_4$ and $H_2O_2$ as reaction gas at a temperature of 0° C.

19. The method of claim 13, wherein said second sacrificial layer comprises spin-on glass (SOG).

20. The method of claim 13, wherein said second etching step is performed by wet dip method, utilizing HF aqueous solution with a concentration of about 0.20 wt. %~49 wt. %.

21. The method of claim 13, wherein said second etching step is performed by wet dip method, utilizing $NH_4F/HF$ aqueous solution with a volume concentration of about 5:1~500:1.

* * * * *